United States Patent [19]
Mahajan et al.

[11] Patent Number: 6,011,696
[45] Date of Patent: Jan. 4, 2000

[54] CARTRIDGE AND AN ENCLOSURE FOR A SEMICONDUCTOR PACKAGE

[75] Inventors: Ravi V. Mahajan, Tempe; Hong Xie, Phoenix, both of Ariz.; Neil C. Delaplane, Tualatin, Oreg.; Gregory A. James, San Jose, Calif.

[73] Assignee: Intel Corporation, Santa Clara, Calif.

[21] Appl. No.: 09/087,455

[22] Filed: May 28, 1998

[51] Int. Cl.[7] ................................. H05K 7/02
[52] U.S. Cl. .................. 361/782; 361/752; 361/785; 361/784; 257/713; 257/698; 257/780; 257/737
[58] Field of Search ................... 257/713, 698, 257/706, 727, 737, 780; 361/782, 752, 784, 785, 788, 790

[56] References Cited

U.S. PATENT DOCUMENTS

| | | | |
|---|---|---|---|
| 5,311,402 | 5/1994 | Kobayashe et al. ............... 361/760 |
| 5,477,933 | 12/1995 | Nguyen ............................ 174/262 |
| 5,642,261 | 6/1997 | Dond et al. ....................... 361/704 |
| 5,659,458 | 8/1997 | Patchen ............................ 361/704 |
| 5,715,144 | 2/1998 | Ameen et al. ..................... 361/790 |
| 5,783,870 | 7/1998 | Mostafazadeh et al. ........... 257/791 |
| 5,892,245 | 4/1999 | Hilton .............................. 257/48 |

*Primary Examiner*—Leo P. Picard
*Assistant Examiner*—David Foster
*Attorney, Agent, or Firm*—Blakely, Sokoloff, Taylor & Zafman LLP

[57] ABSTRACT

An electronic cartridge comprising a cartridge substrate, a package substrate, an integrated circuit, and an enclosure. The package substrate is mounted to the cartridge substrate. The integrated circuit is mounted to the package substrate. The enclosure encloses the integrated circuit, the package substrate and the cartridge substrate.

19 Claims, 2 Drawing Sheets

CARTRIDGE AND AN ENCLOSURE FOR A SEMICONDUCTOR PACKAGE

BACKGROUND OF THE INVENTION

1.) Field of the Invention

This invention relates to a cartridge and to an enclosure for a semiconductor package. More specifically, this invention relates to a cartridge and to an enclosure for a semiconductor package which are specifically designed for lightweight purposes and enhanced thermal performance.

2.) Discussion of related Art

Integrated circuits are manufactured in chip form and then mounted to package substrates. The combination of a package substrate and an integrated circuit mounted on the substrate is called a semiconductor package.

The substrate may have a plurality of contacts that connect the semiconductor package to a printed circuit board such as a computer motherboard or a computer card.

The integrated circuit generates heat which must be conducted away from the integrated circuit.

One technique for conducting heat from the integrated circuit is by coupling a thermally conductive plate to the integrated circuit package. A finned heat sink may then be mounted to the thermally conductive plate. The heat generated by the integrated circuit may then be transferred through the thermally conductive plate to the heat sink and then convected away from the heat sink. Such a construction may prove useful for a desktop computer which is primarily stationary and which usually provides substantial space for accommodating the thermally conductive plate and the heat sink. However, in portable computers such a construction may prove to be too heavy and bulky for practical use.

In addition to the thermally conductive plate and the heat sink, the electronic assembly may have an enclosure to protect the semiconductor package. Such an enclosure may add to the overall weight of the computer.

It is therefore desirable to provide a lightweight solution for purposes of removing heat from the integrated circuit of a semiconductor package and for purposes of protecting the semiconductor package. In addition to providing for heat dissipation, the solution may also provide for removal of any static build-up, provide for containment of electromagnetic emissions and be easily manufacturable.

SUMMARY OF THE INVENTION

An electronic cartridge comprising a cartridge substrate, a package substrate, an integrated circuit, and an enclosure. The package substrate is mounted to the cartridge substrate. The integrated circuit is mounted to the package substrate. The enclosure encloses the integrated circuit, the package substrate and the cartridge substrate.

BRIEF DESCRIPTION OF THE DRAWINGS

The invention is further described by way of example with reference to the accompanying drawings wherein.

DETAILED DESCRIPTION OF THE INVENTION

Figure 1:
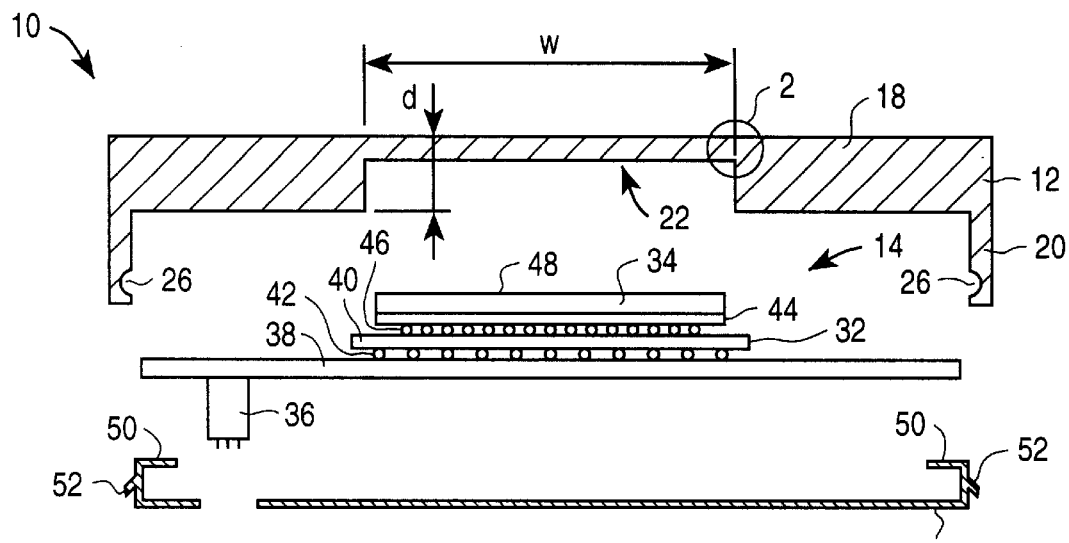
FIG. 1 is a partially sectioned exploded side view of a cartridge according to an embodiment of the invention.

FIG. 1 of the accompanying drawings illustrates a cartridge 10, according to an embodiment of the invention, showing in exploded view a first part, hereinafter referred to as the top cover 12, a semiconductor package 14, and a second part, hereinafter referred to as the back cover 16.

The top cover 12 may be made of metal plate material which may be bent so as to have a central portion 18 and downwardly extending edges 20. Although only two edges 20 are shown, it should be understood that the central portion 18 may be rectangular in shape and four edges may be bent, each on a respective side of the central portion 18.

A recess 22 with a width w may be machined to a required depth d into a lower surface of the central portion 18. After the recess 22 is formed, the central portion 18 may still be left with shoulder portions 24 next to the recess 22. Dimples 26 may be formed in inner surfaces of the edges 20 and near ends of the edges 20.

Figure 2:
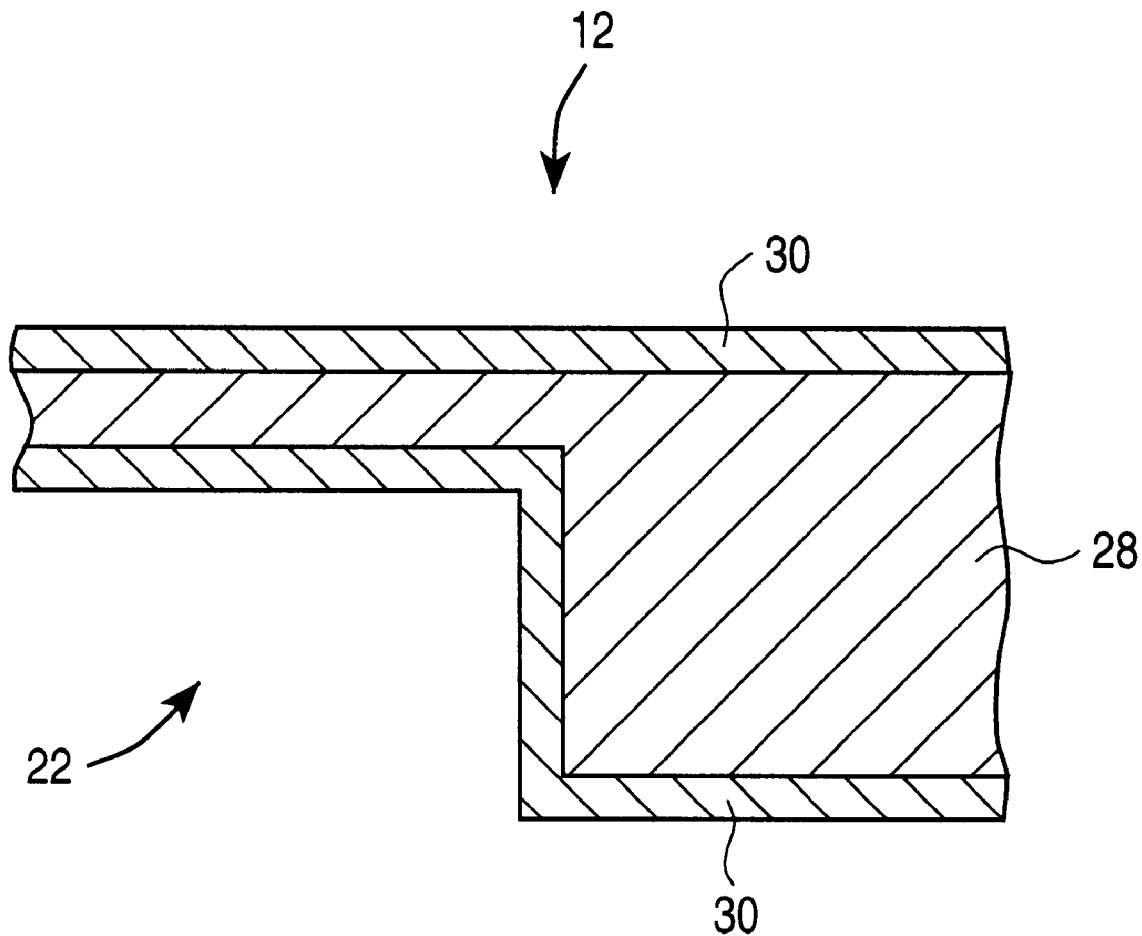
FIG. 2 is an enlarged view of a portion of the cartridge of FIG. 1.

FIG. 2 is an enlarged view of the top cover 12 in an area at an inner corner of the recess 22. The top cover 12 may have a copper core 28 which may be plated with a nickel plating 30 on all sides after the recess 22 is machined, the edges 20 are bent and the dimples 26 are formed. Copper is chosen for its relatively high thermal conductivity (as opposed to for example the thermal conductivity of nickel), and nickel is chosen because nickel has an electrically conductive surface which is not affected by oxidation as much as, for example, copper which forms a non-conductive oxide.

Referring again to FIG. 1, the semiconductor package 14 includes a package substrate 32, an integrated circuit 34 which may be mounted on an upper surface of the package substrate 32.

The package substrate 32 may be mounted to a cartridge substrate 38 by an array of solder balls 42. The integrated circuit 34 may have a front surface in which a circuit 44 is manufactured. The front surface may be mounted to the package substrate 32 by an array of solder bumps 46 with a process commonly referred to as controlled collapse chip connection (C4). A back surface 48 of the integrated circuit 34 may extend into the recess 22. An electrical connector 36 may be attached to the cartridge substrate 38 on a side opposing the package substrate 32.

The cartridge substrate 38 may be sized to fit into the top cover 12 between the edges 20. The package substrate 40 may be slightly larger than the width w of the recess 22. The integrated circuit 34 may be slightly smaller than the width w of the recess 22.

The back cover 16 may also be made of a metal plate material which may have edges that are inwardly bend to form an outer shoulder 50. Projections 52 may be punched out of a peripheral edge of the back cover 16.

The back cover 16 may be made of the same materials and in a similar manner as the top cover 12.

Figure 3:
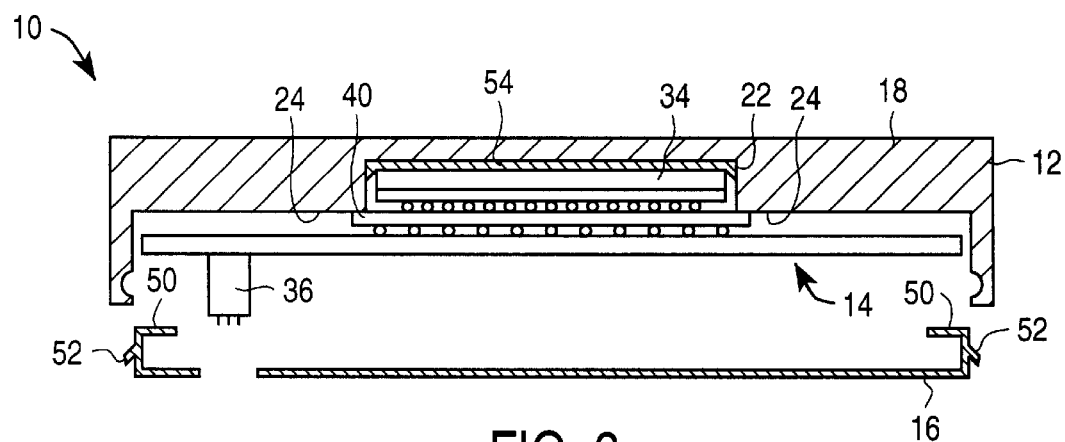
FIG. 3 is a view similar to FIG. 1 wherein the cartridge is partially assembled.

FIG. 3 shows the cartridge of FIG. 1 wherein the semiconductor package 14 and the cartridge substrate are inserted into the top cover 12. The cartridge substrate 38 may fit in between the edges 20. The integrated circuit 34 may fit into the recess 22. The shoulder portions 24 may rest on the package substrate 32. The recess 22 may therefore fit over the integrated circuit 34 and the shoulder portions 24 may rest on the package substrate 32. The depth d may be sufficient to allow for a small gap between opposing surfaces of the semiconductor chip 34 and the top cover 12. The gap may be between 25 microns and 125 microns deep. The gap may be filled with a thermally conductive grease 54. The integrated circuit 34 may so be thermally coupled to the top cover 12 by means of the thermally conductive grease 54.

Figure 4:
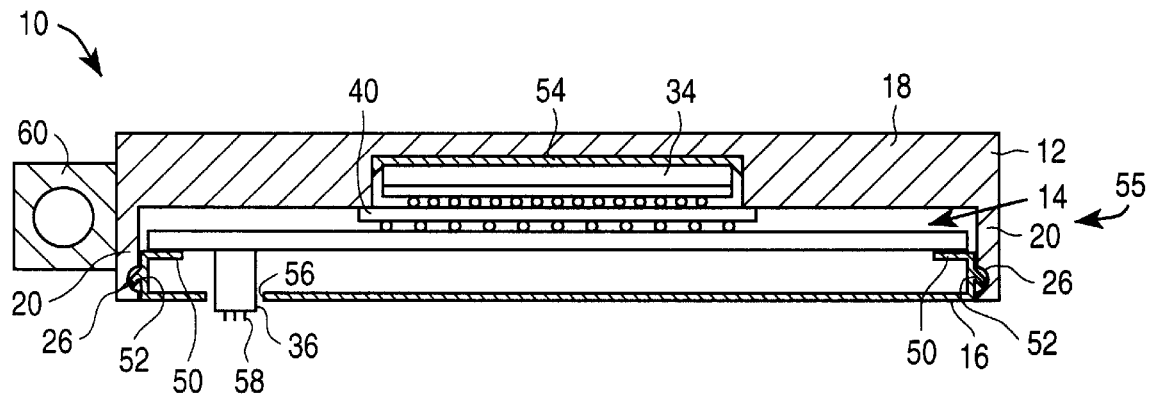
FIG. 4 is a view similar to FIG. 3 wherein the cartridge is fully assembled.

FIG. 4 shows the cartridge of FIG. 3 after the back cover 16 is brought into engagement with the top cover 12. The semiconductor package 14 and the cartridge substrate 38 are thereby held captive within an enclosure 55 defined by the top cover 12 and the back cover 16 jointly. The projections 52 may snap into position within the dimples 26. The shoulders 50 may support the cartridge substrate 38. The shoulders 50 may be spaced from the top cover 12 so that the semiconductor package 14 is prevented from moving within the enclosure 55.

The connector 36 may extend through an opening 56 in the back cover 16. Electrical contacts 58 may be located on the electrical connector 36 externally of the enclosure 55.

A device for conducting and convecting heat from the top cover 12 may then be installed anywhere on the enclosure 55. In FIG. 4, for example, a heat pipe 60 is mounted on one of the downwardly extending edges 20.

The cartridge 10 may be mounted to another device such as a computer motherboard or a card of a computer with the electrical connector 36 plugged into a complementary socket of the other device. The circuit 44 on the integrated circuit 34 would then be placed in electrical communication with the other device. A current can now be applied by the other device and flow through the circuit 44. When current flows through the circuit 44, the integrated circuit 34 generates heat. Heat generated in the integrated circuit 34 may conduct through the thermally conductive grease 54 to the top cover 12. Since the core 28 may be made of copper, the top cover 12 may have relatively good thermal conductivity characteristics which may result in heat being transferred away from the integrated circuit 34 relatively effectively. The heat may then conduct to the heat pipe 60 which transfers the heat away from the cartridge 10.

It can be seen from the aforegoing description that the relatively lightweight top cover 12 serves a dual function, being both a conductor through which heat is conducted away from the integrated circuit 34 and forming part of the enclosure 55 protecting the semiconductor package 14 and the cartridge substrate 38 against mechanical damage. A relatively lightweight cartridge 10 therefore results.

Operation of the circuit and of the semiconductor package 14 in general may cause a certain amount of static to build up on the cartridge. The nickel of the plating 30, having a relatively high electrical conductivity, provides sufficient means for conducting the static to a grounding point. The top cover 12 or the back cover 16 may, for example, be electrically connected to another device such as a computer motherboard or a card. By so connecting the top cover 12 or the back cover 16 to the other device any static build-up on the cartridge can be conducted to the other device with the nickel plating 30 acting as a good conductor for conducting the static away. Nickel, in addition, does not oxidize as easily as copper, making the enclosure 55 easier to ground.

Operation of the circuit also results in electromagnetic emission from the circuit. The electromagnetic emission is taken up by the enclosure 55. Since the enclosure 55 is grounded, the electromagnetic emissions from the enclosure 55 to an area surrounding the enclosure 55 is reduced.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

We claim:

1. A cartridge comprising:
   a semiconductor package including:
      a cartridge substrate;
      electrical contacts on the cartridge substrate;
      a package substrate mounted to the cartridge substrate; and
      an integrated circuit mounted to the package substrate; and
   an enclosure that encloses the semiconductor package, the enclosure having an opening over the electrical contacts and including first and second portions located on opposing sides of the semiconductor package and a third portion extending between the first and second portions past the semiconductor package.

2. The cartridge of claim 1 further comprising a circuit in a side of the integrated circuit facing the substrate, and an array of electrical connections between the integrated circuit and the package substrate.

3. The cartridge of claim 2 wherein the electrical connections are solder bumps.

4. The cartridge of claim 1 further comprising an electrical connection mounted to the cartridge substrate and extending through the opening, the electrical contacts being located on the electrical connection at a location externally of the enclosure.

5. The cartridge of claim 1 wherein the electrical contacts and the integrated circuit are located on opposing sides of the cartridge substrate.

6. The cartridge of claim 1 wherein opposing surfaces of the integrated circuit and the enclosure are thermally coupled to one another.

7. The cartridge of claim 6 further comprising a substance which thermally couples opposing surfaces of the integrated circuit and the enclosure to one another.

8. The cartridge of claim 7 wherein the substance is a grease.

9. The cartridge of claim 1 wherein the enclosure includes a recess fitting over the integrated circuit, and a shoulder portion which rests on the package substrate in an area next to the integrated circuit.

10. The cartridge of claim 1 wherein the enclosure is made of first and second layers of materials, the first material having a higher thermal conductivity than the second material.

11. The cartridge of claim 10 wherein one of the materials is plated on the other.

12. The cartridge of claim 11 wherein the second material is plated on the first material.

13. The cartridge of claim 12 wherein the second material is located on both sides of the first material.

14. The cartridge of claim 10 wherein the first material is copper.

15. The cartridge of claim 10 wherein the second material is nickel.

16. The cartridge of claim 1 wherein the enclosure includes two parts which are secured to one another to retain the semiconductor package within the enclosure.

17. The cartridge of claim 16 wherein the two parts are secured to one another by means of dimples and complementary projections located within the dimples.

18. An enclosure for a semiconductor package including a cartridge substrate, a package substrate mounted to the cartridge substrate, and an integrated circuit mounted on the package substrate, the enclosure comprising:

a first part having a first portion having a recess for receiving the integrated circuit and a shoulder portion for resting on the package substrate in an area next to the integrated circuit, the first part in the first portion of the recess being made of first and second layers of materials, the first material having a higher thermal conductivity than the second material; and a second part which is securable to the first part so that the first and second parts jointly enclose the semiconductor package, the second part having a second portion located on a side of the semiconductor package opposing the first portion.

19. A cartridge comprising:

semiconductor package including:

a cartridge substrate;

a package substrate mounted to the cartridge substrate; and an integrated circuit mounted to the package substrate; and an enclosure that encloses the semiconductor package, the enclosure including first and second portions located on opposing sides of the semiconductor package and a third portion extending between the first and second portion past the semiconductor package, wherein opposing surfaces of the integrated circuit and the first portion are thermally coupled to one another.

* * * * *